(12) United States Patent
Matsumura et al.

(10) Patent No.: US 9,541,808 B2
(45) Date of Patent: *Jan. 10, 2017

(54) LIQUID CRYSTAL DISPLAY DEVICE

(71) Applicant: JAPAN DISPLAY INC., Tokyo (JP)

(72) Inventors: Kazune Matsumura, Mobara (JP); Hideo Sato, Hitachi (JP); Keita Sasanuma, Mobara (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/002,507

(22) Filed: Jan. 21, 2016

(65) Prior Publication Data

US 2016/0139471 A1    May 19, 2016

Related U.S. Application Data

(63) Continuation of application No. 13/609,340, filed on Sep. 11, 2012, now Pat. No. 9,274,391.

(30) Foreign Application Priority Data

Sep. 30, 2011    (JP) ................................. 2011-216936

(51) Int. Cl.
*G02F 1/1362* (2006.01)
*G02F 1/1368* (2006.01)
*H01L 27/12* (2006.01)

(52) U.S. Cl.
CPC ....... *G02F 1/136209* (2013.01); *G02F 1/1368* (2013.01); *G02F 1/13624* (2013.01);
(Continued)

(58) Field of Classification Search
None
See application file for complete search history.

(56) References Cited

U.S. PATENT DOCUMENTS 9,274,391 B2 *   3/2016   Matsumura ....... G02F 1/136209
2011/0109853 A1   5/2011   Ge et al.

FOREIGN PATENT DOCUMENTS

JP    2001-33822        2/2001
JP    2003-298069 A    10/2003
WO    2011027650 A1    3/2011

OTHER PUBLICATIONS

Office Action dated Apr. 14, 2015 regarding a counterpart Japanese patent application No. 2011216936.

* cited by examiner

*Primary Examiner* — Kenneth B Lee, Jr.
(74) *Attorney, Agent, or Firm* — Typha IP LLC

(57) ABSTRACT

A liquid crystal display device includes a first substrate on which a thin film transistor is formed. The liquid crystal display device includes a first transistor which has a gate electrode thereof formed on a side more remote from the first substrate than a semiconductor layer and has a drain electrode thereof connected to the drain line, a second transistor which is connected to the first transistor in series, and has a source electrode thereof electrically connected to a pixel electrode, and a light blocking layer which is formed between the semiconductor layer and the first substrate and blocks a backlight incident from a first substrate side. The light blocking layer is formed in an overlapping manner on the first transistor, blocks a backlight incident on a first transistor side, and allows a backlight incident on a second transistor side to pass therethrough.

5 Claims, 17 Drawing Sheets

(52) U.S. Cl.
CPC ...... *G02F 1/136286* (2013.01); *H01L 27/124* (2013.01); *H01L 27/1222* (2013.01); *H01L 27/1251* (2013.01); *G02F 2001/13685* (2013.01)

FIG. 9
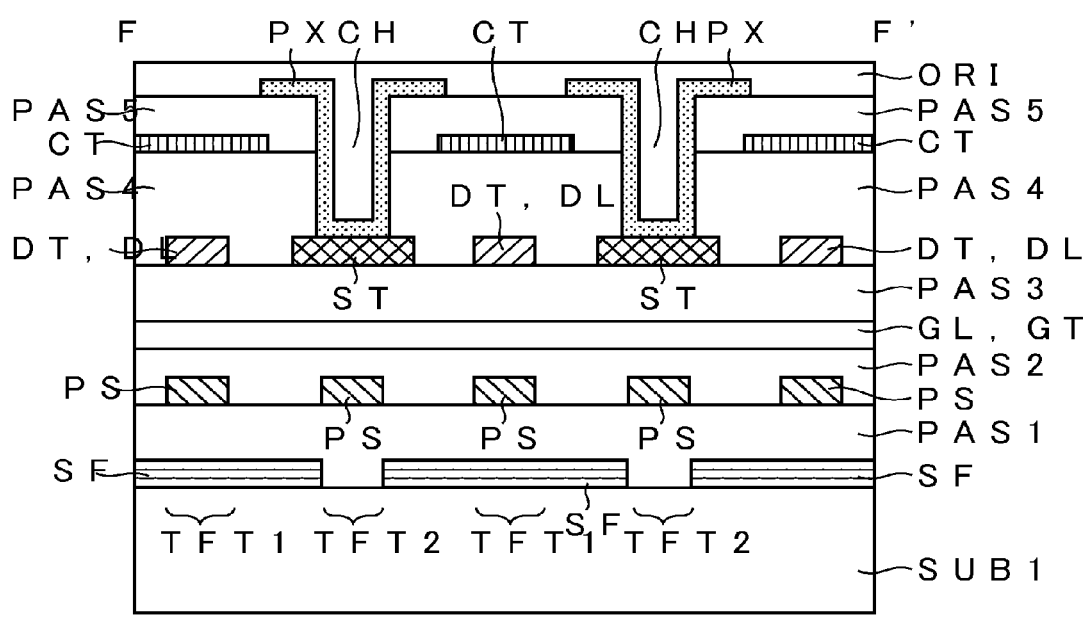
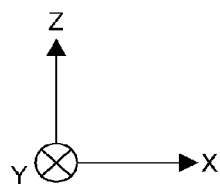

200
LIQUID CRYSTAL DISPLAY DEVICE

CROSS-REFERENCE TO RELATED APPLICATION

This application is a continuation of U.S. patent application Ser. No. 13/609,340, filed on Sep. 11, 2012, which claims the priority from Japanese Patent Application No. JP 2011-216936 filed on Sep. 30, 2011, the entire application disclosures of which are hereby incorporated by reference.

BACKGROUND OF THE INVENTION

1. Field of the Invention

The present invention relates to a liquid crystal display device, and more particularly to blocking of light in a top-gate-type thin film transistor formed for every pixel.

2. Description of the Related Art

A liquid crystal display device is constituted such that a first substrate on which thin film transistors and the like are formed and a second substrate on which color filters and the like are formed are arranged facing each other with a liquid crystal layer sandwiched therebetween. Particularly, as shown in FIG. 14, in a conventional liquid crystal display device where each thin film transistor has the double gate structure constituted of two top-gate-type thin film transistors TFT1, TFT2, a pixel electrode PX is formed for every region surrounded by scanning signal lines (gate lines) GL which extend in the X direction and are arranged parallel to each other in the Y direction and video signal lines (drain lines) DL which extend in the Y direction and are arranged parallel to each other in the X direction thus forming a pixel region. Two thin film transistors TFT1, TFT2 which are connected in series are formed in the vicinity of a region where the gate line GL and the drain line DL intersect with each other, and a video signal is supplied to the pixel electrode PX from a source electrode ST of the thin film transistor TFT2 via these two thin film transistors TFT1, TFT2. In such a constitution, as can be understood from FIG. 15 which is a cross-sectional view taken along a line K-K' in FIG. 14, a semiconductor layer PS which forms two thin film transistors TFT1, TFT2 is configured to be laminated on a side closer to the first substrate SUB1 than to the gate line GL which is formed of a metal thin film or the like. In view of such structure, for suppressing a light leak current generated due to the incidence of a backliqht light BL indicated by an arrow into the semiconductor layer PS, there has been proposed the forming of a light blocking layer for blocking the backlight light BL. In FIG. 15, insulation films PAS1 to PAS5 are thin film layers which insulate the respective thin film layers such as the semiconductor layer PS, and the thin film layer which constitutes the uppermost layer of the first substrate SUB1 is an orientation film ORI.

As a liquid crystal display device where the light blocking layer is formed, there has been known a liquid crystal display device described in JP 2001-33822 A, for example. The liquid crystal display device described in JP 2001-33822 A is configured such that when one thin film transistor is arranged for every pixel, an area of the light blocking layer is formed smaller than an area of a semiconductor layer, and the light blocking layer is arranged so as to cover a source electrode side of the thin film transistor, that is, a side of the thin film transistor which is connected to a pixel electrode. Further, when the liquid crystal display device uses a top-gate-type thin film transistor having the double gate structure, blocking of light is applied to a thin film transistor on a side closer to the pixel electrode by a blocking film.

SUMMARY OF THE INVENTION

However, as can be understood from an equivalent circuit of a pixel shown in FIG. 16, a capacitance (holding capacitance) Cst for holding a video signal for a predetermined period is formed on a source electrode side of the thin film transistor TFT, and a capacitance (gate-source capacitance) Cgs is also formed between a gate electrode and a source electrode of the thin film transistor. When the liquid crystal display device adopts the constitution where the top-gate-type thin film transistor is covered with the light blocking layer, in addition to the above-mentioned capacitances Cst, Cgs, a capacitance C1 is formed between a drain electrode of the thin film transistor TFT and a light blocking layer SF, and also a capacitance C2 is formed between the light blocking layer SF and the gate line GL and a capacitance C3 is formed between the light blocking layer SF and the thin film transistor. In this case, a capacitance between the gate electrode and the source electrode of the thin film transistor TFT becomes a total capacitance of the capacitance C2 and the capacitance C3 connected in series via the light blocking layer SF and the gate-source capacitance Cgs. Here, when the liquid crystal display device uses the top-gate-type thin film transistor TFT, the source electrode and the light blocking layer SF are arranged in an overlapping manner on an insulation film constituting one layer therebetween and hence, the capacitance C3 between the light blocking layer SF and the thin film transistor also becomes extremely large capacitance. Accordingly, with the provision of the light blocking layer SF, the capacitance between the gate and the source of the thin film transistor TFT is largely increased thus giving rise to a possibility that a feed-through voltage when a gate is off is increased. In this manner, in the constitution described in JP 2001-33822 A, the thin film transistor on a side where the thin film transistor TFT is directly connected to the pixel electrode is covered with the light blocking layer thus giving rise to a possibility that a feed-through voltage when a gate is off is increased thus lowering the display quality.

Particularly, a delay amount in a scanning signal (gate signal) supplied to the thin film transistor TFT from the gate line GL differs within a display region corresponding to a line load of the gate line and hence, at the time of negative-electrode writing, when a load of the gate line GL is small so that a gate waveform changes steeply, a feed-through voltage becomes large. On the other hand, when the load of the gate line GL is large so that a rectangular scanning signal waveform (gate waveform) is rounded, a feed-through voltage is decreased by rewriting. Accordingly, when the light blocking layer is formed such that the light blocking layer covers the thin film transistor connected to the pixel electrode, the deviation of the feed-through voltage occurs within the display region so that a holding voltage changes within a display screen and this voltage change influences image quality thus giving rise to a possibility that the image retention or the difference in in-plane brightness is increased.

The present invention has been made in view of the above-mentioned drawbacks, and it is an object of the present invention to provide a technique which can enhance display quality by decreasing an off-leak current of a top-gate-type thin film transistor.

To overcome the above-mentioned drawbacks, according to one aspect of the present invention, there is provided a liquid crystal display device which comprises: a first substrate on which gate lines which extend in the X direction and are arranged parallel to each other in the Y direction, drain lines which extend in the Y direction and are arranged parallel to each other in the X direction, and a thin film transistor which outputs a video signal from the drain line to a pixel electrode in synchronism with a scanning signal from the gate line are formed; and a second substrate which is arranged facing the first substrate in an opposed manner with a liquid crystal layer sandwiched therebetween, wherein the thin film transistor is formed of a top-gate-type thin film transistor which has a gate electrode thereof formed on a side more remote from the first substrate than a semiconductor layer, the thin film transistor is constituted of a first thin film transistor which has a drain electrode thereof electrically connected to the drain line, and a second thin film transistor which is connected to the first thin film transistor in series, has a drain electrode thereof connected to a source electrode of the first thin film transistor, and has a source electrode thereof electrically connected to the pixel electrode, and includes a light blocking layer which is formed between the semiconductor layer and the first substrate and blocks a backlight light incident from a first substrate side, the light blocking layer is formed in an overlapping manner on the first thin film transistor as viewed in a plan view, and blocks a backlight light incident on a first thin film transistor side, and allows a backlight light incident on a second thin film transistor side to pass therethrough.

According to the present invention, display quality can be enhanced by decreasing an OFF leak current of a top-gate-type thin film transistor.

Other advantageous effects of the present invention will become apparent from the description of the whole specification.

BRIEF DESCRIPTION OF THE DRAWINGS

FIG. 9 is a cross-sectional view taken along a line F-F' in FIG. 8;

DETAILED DESCRIPTION OF THE INVENTION

Figure 1:
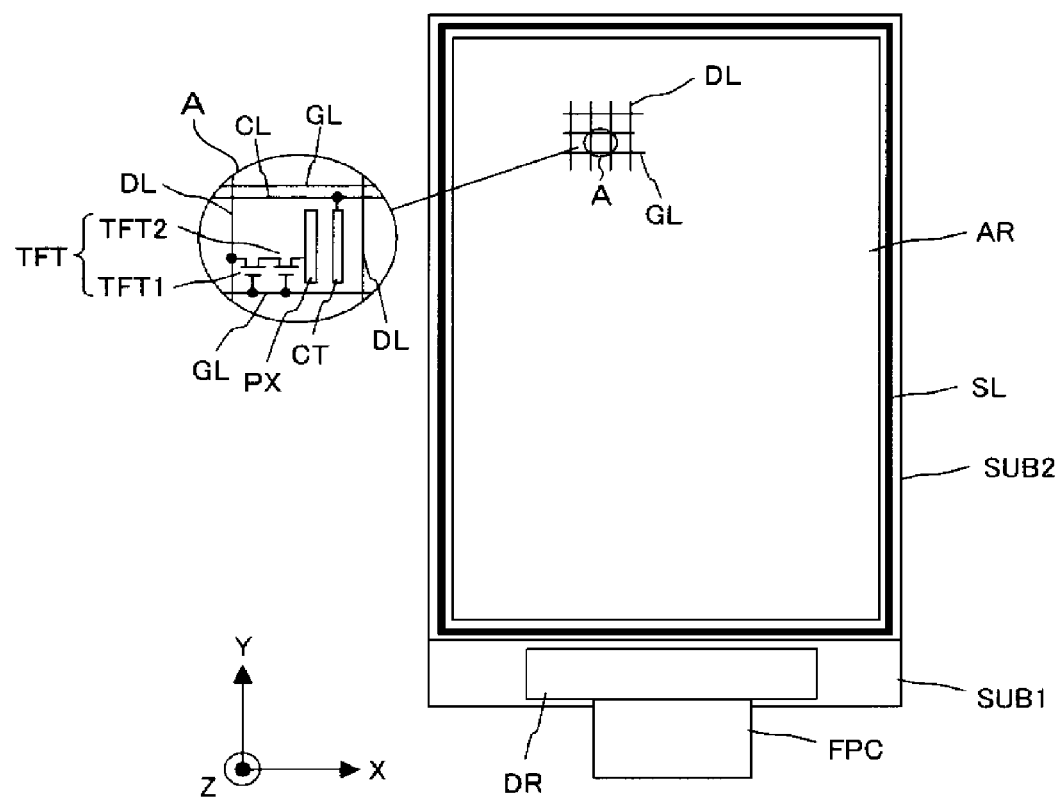
FIG. 1 is a view for explaining the overall constitution of a liquid crystal display device according to an embodiment 1 of the present invention.

Hereinafter, embodiments to which the present invention is applied are explained in conjunction with drawings. However, in the explanation made hereinafter, same symbols are given to identical constitutional elements, and the repeated explanation of these constitutional parts is omitted. Further, X, Y, Z in the drawing indicate an X axis, a Y axis and a Z axis respectively.

Embodiment 1

Overall Constitution

FIG. 1 is a view for explaining the overall constitution of a liquid crystal display device of an embodiment 1 of the present invention. Hereinafter, the constitution of the liquid crystal display device of the embodiment 1 is explained in conjunction with FIG. 1. As shown in FIG. 1, the liquid crystal display device of the embodiment 1 includes a liquid crystal display panel which is constituted of a first substrate SUB1 on which pixel electrode PX and the like are formed, a second substrate SUB2 on which color filters and a black matrix not shown in the drawing are formed and which is arranged facing the first substrate SUB1 in an opposed manner; and a liquid crystal layer not shown in the drawing which is sandwiched between the first substrate SUB1 and the second substrate SUB2. The liquid crystal display device is constituted by combining the liquid crystal display panel and a backlight unit (backlight device) not shown in the drawing which constitutes a light source for the liquid crystal display panel.

Fixing of the first substrate SUB1 and the second substrate SUB2 to each other and sealing of liquid crystal are performed such that the first substrate SUB1 and the second substrate SUB2 are fixed to each other by a sealing material SL which is annularly applied to a peripheral portion of the second substrate SUB2 and liquid crystal is sealed in a space formed between the first substrate SUB1 and the second substrate SUB2. Further, an area of the second substrate SUB2 is set smaller than an area of the first substrate SUB1 so that a side portion of the first substrate SUB1 on a lower side of the drawing is exposed. A drive circuit DR which is constituted of a semiconductor chip is mounted on the side portion of the first substrate SUB1. The drive circuit DR drives respective display pixels (hereinafter, abbreviated as pixel) in a display region AR described later in detail. In the explanation made hereinafter, even in the explanation of the liquid crystal display panel, the liquid crystal display panel is expressed as a liquid crystal display device.

As a base material of the first substrate SUB1 and the second substrate SUB2, for example, a well-known glass substrate is used in general. However, the base material is not limited to a glass substrate, and may be other insulating substrates such as a quartz glass substrate or a plastic (resin) substrate. For example, with the use of the quartz glass substrate, a process temperature can be elevated and hence, a gate insulation film of a thin film transistor TFT described later can be densified whereby the reliability of the thin film transistor TFT can be enhanced. On the other hand, when a plastic (resin) substrate is used as the base material, it is possible to provide a light weighted liquid crystal display device having excellent shock resistance.

In the liquid crystal display device of the embodiment 1, a region where pixels are formed within an area where liquid crystal is sealed constitutes a display region AR. Accordingly, a region with no pixels and thus not contributing to the display does not constitute the display region AR even when the region falls within the area where liquid crystal is sealed.

In the liquid crystal display device of the embodiment 1, on a liquid-crystal-side surface of the first substrate SUB1 and within the display region AR, scanning signal lines (gate lines) GL which extend in the X direction and are arranged parallel to each other in the Y direction in FIG. 1 are formed. Further, in FIG. 1, video signal lines (drain lines) DL which extend in the Y direction and are arranged parallel to each other in the X direction are formed. A rectangular region surrounded by the drain lines DL and the gate lines GL constitutes a region where the pixel is formed. Due to such a constitution, the respective pixels are arranged in a matrix array within the display region AR. Each pixel, for example, as shown in an equivalent circuit diagram A' in a circle A in FIG. 1, includes: the thin film transistor TFT having the double gate structure which is constituted of two top-gate-type thin film transistors (a first thin film transistor TFT1 and a second thin film transistor TFT2) which are turned on/off in response to a scanning signal through the gate line GL; a pixel electrode PX to which a video signal from the drain line DL is supplied via the thin film transistors TFT1, TFT2 in an ON state; and a common electrode CT which is formed over at least the entire surface of the display region AR and to which a common signal having a potential which becomes the reference with respect to a potential of a video signal is supplied from one end or both sides of the left and right in the X direction (edge portions of the first substrate SUB1) via a common line CL. Here, the thin film transistor TFT is formed of a so-called top-gate-type thin film transistor having the double gate structure which is constituted of two thin film transistors TFT1, TFT2 connected to each other in series. Accordingly, one thin film transistor TFT1 has a drain electrode thereof connected to the drain line DL and a gate electrode thereof connected to the gate line GL. The other thin film transistor TFT2 has a source electrode thereof connected to the pixel electrode PX, has a gate electrode thereof connected to the same gate line GL as the thin film transistor TFT1, and a source electrode of the thin film transistor TFT1 and a drain electrode of the thin film transistor TFT2 are electrically connected to each other.

An electric field having a component parallel to a main plane of the first substrate SUB1 is generated between the pixel electrode PX and the common electrode CT, and molecules of liquid crystal are driven by this electric field. Such a liquid crystal display device is known as a display device which can perform so-called wide viewing angle display, and is referred to as an IPS (In-plane Switching) display device or a lateral-electric-field display device because of uniqueness of applying of an electric field to liquid crystal. In the liquid crystal display device having such a constitution, the display is performed in a normally black display mode where optical transmissivity becomes minimum (black display) when an electric field is not applied to liquid crystal and optical transmissivity is increased by applying an electric field. The present invention is not limited to the liquid crystal display device where the common electrode CT is formed on a first substrate SUB1 side, and is also applicable to other liquid crystal display devices such as a TN (Twisted Nematic) liquid crystal display device or a VA (Vertical Alignment) liquid crystal display device where the common electrode CT is formed on the second substrate SUB2. Further, in the liquid crystal display device of the embodiment 1, the common electrode CT is formed on at least the whole surface of the display region AR. However, the present invention is not limited to such a constitution and, for example, as shown in the equivalent circuit diagram A', a common signal may be inputted to the common electrode CT formed independently for every pixel via a common line CL.

The respective drain lines DL and the respective gate lines GL extend beyond a sealing material SL respectively at end portions thereof, and are connected to a drive circuit DR which generates drive signals such as video signals and scanning signals based on display control signals from an external system. Although the drive circuit DR is formed of a semiconductor chip and is mounted on the first substrate SUB1 in the liquid crystal display device of the embodiment 1, either one or both of a video signal drive circuit for outputting a video signal and a scanning signal drive circuit for outputting a scanning signal may be mounted on a flexible printed circuit board FPC by a tape carrier method or a COF (Chip On Film) method and may be connected to the first substrate SUB1.

<Constitution of Pixel>

Figure 2:
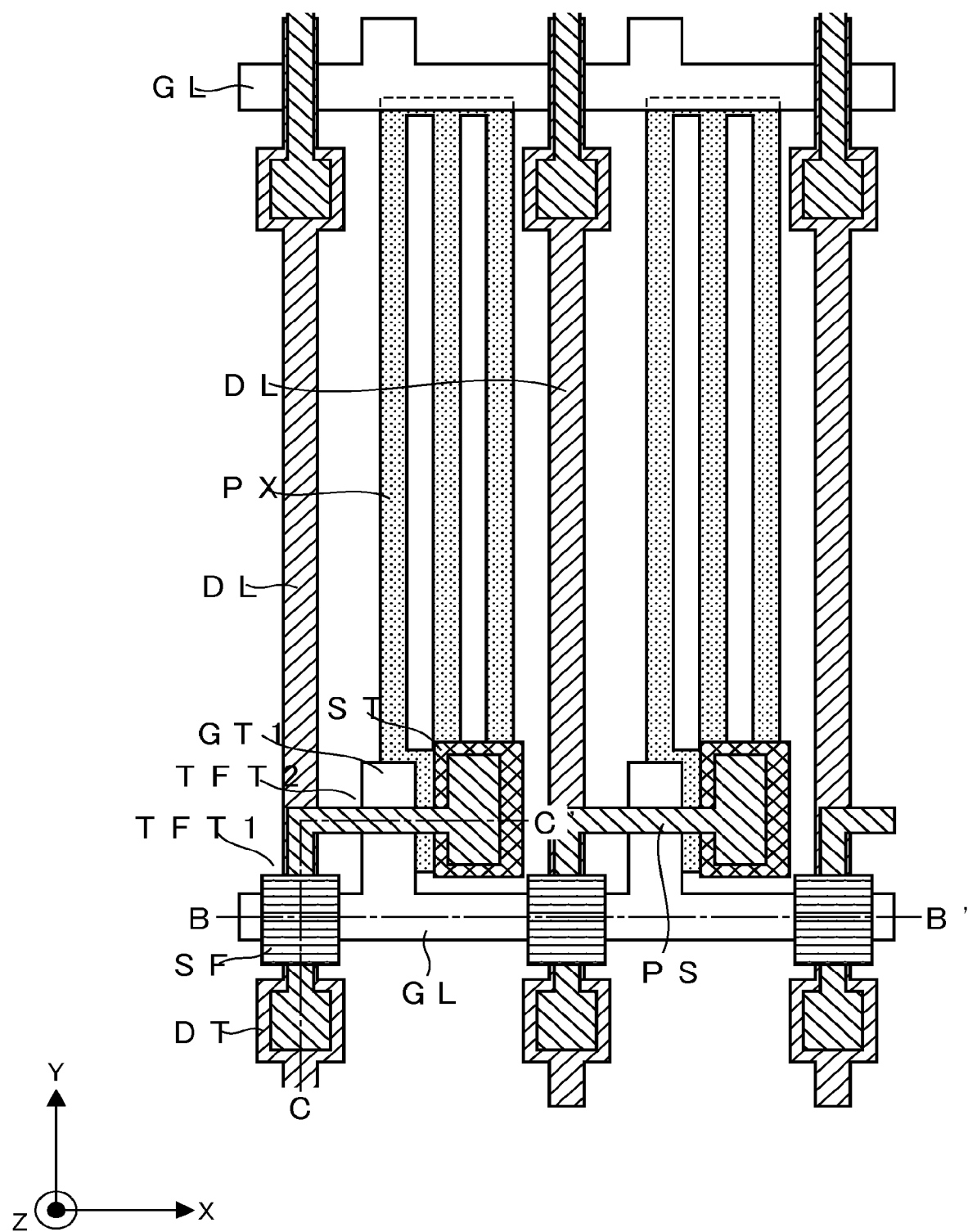
FIG. 2 is a plan view for explaining the detailed constitution of a pixel in the liquid crystal display device of the embodiment 1 of the present invention.
Figure 3:
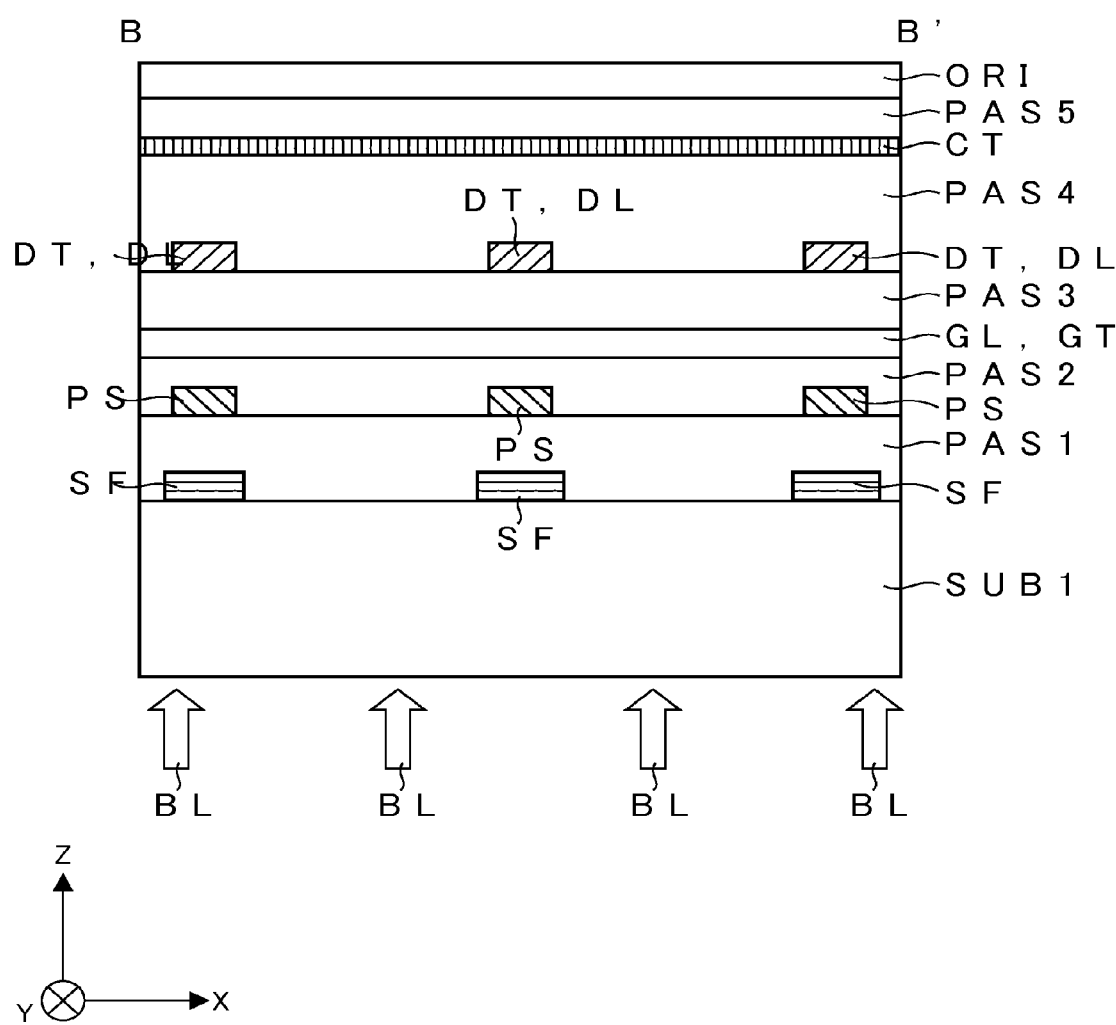
FIG. 3 is a cross-sectional view taken along a line B-B' in FIG. 2.
Figure 4:
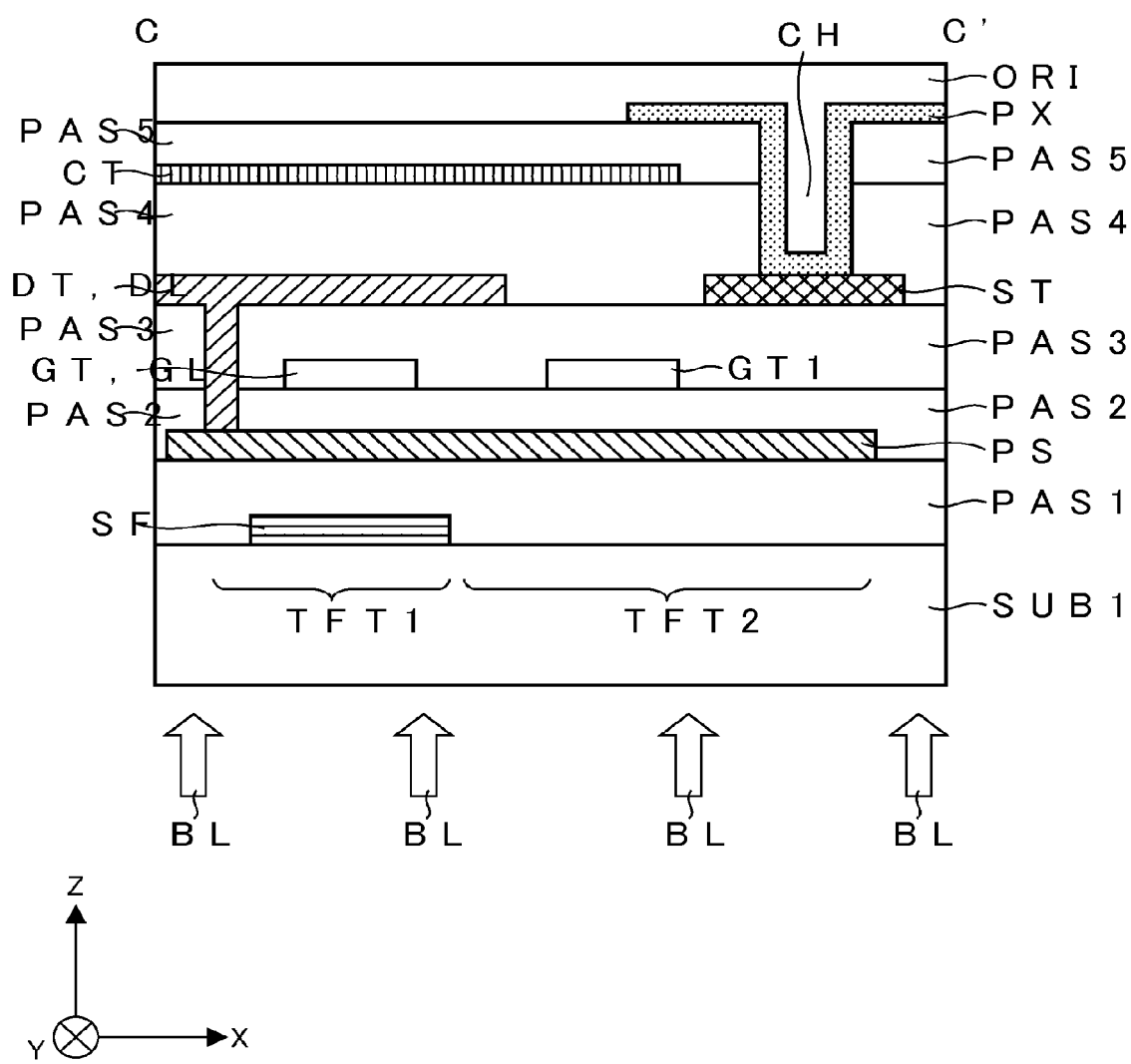
FIG. 4 is a cross-sectional view taken along a line C-C' in FIG. 2.

FIG. 2 is a plan view for explaining the detailed constitution of the pixel in the liquid crystal display device of the embodiment 1 of the present invention, FIG. 3 is a cross-sectional view taken along a line B-B' in FIG. 2, and FIG. 4 is a cross-sectional view taken along a line C-C' in FIG. 2.

As shown in FIG. 2, in the liquid crystal display device using the top-gate-type thin film transistors TFT1, TFT2 having the double gate structure, the linear pixel electrode PX is formed for every region surrounded by the gate lines GL which extend in the X direction and are arranged parallel to each other in the Y direction and the drain lines DL which extend in the Y direction and are arranged parallel to each other in the X direction. Two thin film transistors TFT1, TFT2 are formed in the vicinity of a region where the gate line GL and the drain line DL intersect with each other. A semiconductor layer PS which forms these two thin film transistors TFT1, TFT2 extends along the drain line DL such that the semiconductor layer PS intersects with the gate line GL and, thereafter, is bent in the extension direction of the gate line GL, and intersects with an extending portion GT1 extended from the gate line GL. That is, with respect to the semiconductor layer PS of the embodiment 1, in each pixel, one end side of the semiconductor layer PS is electrically connected to the drain line DL on a side below the gate line GL extending in the X direction in FIG. 2, and the other end side of the semiconductor layer PS is electrically connected to a source electrode ST, that is, the pixel electrode PX on a side above the gate line GL in FIG. 2. Further, the semiconductor layer PS is connected to the drain line DL (drain electrode DT) and a source electrode ST (pixel electrode PX) respectively at two regions divided by the gate line GL. Due to such a constitution, the thin film transistor TFT1 which uses the gate line GL as a gate electrode is formed in a region where the semiconductor layer PS and the gate line GL intersect with each other, and the thin film transistor TFT2 which uses an extending portion GT1 as a gate electrode is formed in a region where the semiconductor layer PS and the extending portion GT1 intersect with each other.

In this manner, two thin film transistors TFT1, TFT2 are formed along the same semiconductor layer PS and hence, the thin film transistor TFT having the double gate structure is formed by two thin film transistors TFT1, TFT2. Further, in the thin film transistor TFT having the double gate structure, the light blocking layer SF is formed so as to overlap with only the thin film transistor TFT1 side where the drain electrode is directly connected to the drain line DL. That is, the light blocking layer SF is formed at a position where the light blocking layer SF overlaps with a channel region of the thin film transistor TFT1 as viewed in a plan view from a liquid crystal surface side of the first substrate SUB1 which is a display screen side of the liquid crystal display device, and the light blocking layer SF is not formed in a channel region of the thin film transistor TFT2. Particularly, as shown in FIG. 4, the light blocking layer SF of the embodiment 1 is configured to cover only the channel region of the thin film transistor TFT1 from the first substrate SUB1 side thus preventing a backlight light BL indicated by an arrow in the drawing from being incident on the channel region of the thin film transistor TFT1.

The light blocking layer SF of the embodiment 1 is, as can be clearly understood from FIG. 4 which is a cross-sectional view taken along the semiconductor layer PS, formed of a thin film material having light blocking property such as a metal thin film, for example, so that the light blocking layer SF which is not fixed to a specific potential is formed on a liquid crystal layer side (opposedly facing surface side) of the first substrate SUB1. As described previously, the light blocking layer SF is formed so as to cover the channel region of the thin film transistor TFT1 which constitutes one thin film transistor for forming the thin film transistor TFT having the double gate structure. Here, a size of the light blocking layer SF in the channel direction of the thin film transistor TFT1 is set larger than at least a channel length of the thin film transistor TFT1, and covers a channel region of the thin film transistor TFT1.

That is, one end of the light blocking layer SF of the embodiment 1 is formed more on a drain region side than the channel region of the thin film transistor TFT1, and the other end of the light blocking layer SF is formed more on a source region side than the channel region of the thin film transistor TFT1 so that a parasitic capacitance brought about due to the formation of the light blocking layer SF is decreased. With respect to the position where the other end side of the light blocking layer SF is formed, the other end side of the light blocking layer SF may be formed in a region from a source-side end portion of the channel region of the thin film transistor TFT1 to a drain region of the thin film transistor TFT2. Accordingly, in the thin film transistor having the double gate structure of the embodiment 1, the channel region of the thin film transistor TFT which is directly connected to the drain line DL is formed in an overlapping manner on the light blocking layer SF, and the light blocking layer SF does not overlap with the source electrode ST, that is, the channel region of the thin film transistor TFT2 which is directly connected to the pixel electrode PX.

Next, the pixel structure of the embodiment 1 is explained in detail in conjunction with FIG. 3 and FIG. 4. The light blocking layer SF is formed on an upper surface of the first substrate SUB1, an insulation film PAS1 is formed on the upper surface of the first substrate SUB1 in such a manner that the insulation film PAS1 also covers the light blocking layer SF, and the semiconductor layer PS is formed on an upper layer of the insulation film PAS1. The semiconductor layer PS of the embodiment 1 is, for example, formed of a low-temperature polysilicon (LTPS) layer which is formed by forming a well-known amorphous silicon layer and, thereafter, by poly-crystallizing the amorphous silicon layer by laser annealing or the like. In this case, also in the semiconductor layer PS of the embodiment 1, in the same manner as a conventional semiconductor layer, regions having high impurity concentration are formed with respect to the extension direction of the semiconductor layer PS such that the regions sandwich channel regions corresponding to the gate electrodes GT, GT1, wherein one region out of the regions having high impurity concentration constitutes the drain region (for example, the left-side region of the gate electrode GT in FIG. 4), and the other region (for example, the right-side region of the gate electrode GT in FIG. 4) constitutes a source region. However, it may be possible to adopt the LDD (Lightly Doped Drain) structure where a region having low the impurity concentration is formed in a region between a drain region and a channel layer of the semiconductor layer PS and a region between a source region and the channel layer of the semiconductor layer PS. The semiconductor layer PS is not limited to low-temperature polysilicon, and the semiconductor layer PS may be formed of high-temperature polysilicon, micro-crystalline silicon or the like.

An insulation film PAS2 is formed on an upper surface of the semiconductor layer PS in such a manner that the insulation film PAS2 also covers an upper surface of the insulation film PAS1. The gate lines GL, and the extension portions GT1 extending from the gate lines GL are formed on an upper surface of the insulation film PAS2. The insulation film PAS2 is formed so as to function as a gate insulation film for the thin film transistors TFT1, TFT2. The gate line GL which overlaps with the semiconductor layer PS by way of the insulation film PAS2 constitutes the gate electrode GT of the thin film transistor TFT1, and the extension portion GT1 which overlaps with the semiconductor layer PS by way of the insulation film PAS2 constitutes the gate electrode of the thin film transistor TFT2.

An insulation film PAS3 is formed on upper surfaces of the gate lines GL in such a manner that the insulation film PAS3 covers surfaces of the extension portions GT1 and the surface of the insulation film PAS2, and the source electrodes ST of the thin film transistors TFT2 and the drain lines DL are formed on a surface of the insulation film PAS3. Above one end side of the semiconductor layer PS, a contact hole which reaches a surface of the semiconductor layer PS by penetrating the insulation films PAS2, PAS3 is formed so that one end side of the semiconductor layer PS and the drain line DL are electrically connected with each other via the contact hole thus forming the drain electrode DT of the thin film transistor TFT1. In the same manner, on the other end side of the semiconductor layer PS, a contact hole not shown in the drawing which reaches the surface of the semiconductor layer PS by penetrating the insulation films PAS2, PAS3 is formed so that the other end side of the semiconductor layer PS and the source electrode ST are electrically connected with each other via the contact hole thus forming the source electrode ST of the thin film transistor TFT2.

An insulation film PAS4 which is formed using an organic insulation film material and also functions as a leveling film on a liquid crystal surface side of the first substrate SUB1 is formed on surfaces of the drain line DL and surfaces of the source electrodes ST such that the insulation film PAS4 also covers a surface of the insulation film PAS3, and the planar common electrode CT is formed on a surface of the insulation film PAS4. The common electrode CT is formed using a transparent conductive film material such as well-known ITO (Indium Tin Oxide), AZO (Aluminum doped Zinc Oxide) or GZO (Gallium doped Zinc Oxide). An insulation film PAS5 which also functions as a capacitance insulation film is formed on a surface of the common electrode CT in such a manner that the insulation film PAS5 also covers the surface of the insulation film PAS4, and the pixel electrodes PX are formed on a surface of the insulation film PAS5. Here, the pixel electrodes PX is formed such that an end portion of the pixel electrode PX and the source electrode ST overlap with each other as viewed from a liquid crystal surface side. In a region where the end portion of the pixel electrode PX and the source electrode ST overlap with each other, a contact hole CH which reaches a surface of the source electrode ST from the surface of the insulation film PAS5 by way of the insulation film PAS4 is formed, and the source electrode ST and the pixel electrode PX are electrically connected with each other via the contact hole CH. A well-known orientation film ORI is formed on the surface of the insulation film PAS5 in such a manner that the orientation film ORI also covers the pixel electrodes PX.

Further, as shown in FIG. 3, in the direction along the gate line GL which is formed in an extending manner in the X direction, the light blocking layer SF is formed with a width larger than a width of the semiconductor layer PS. Accordingly, the light blocking layer SF can prevent a backlight light incident from a back surface side of the first substrate SUB1 indicated by an arrow BL in FIG. 3 from being incident on the channel region of the semiconductor layer PS.

As explained above, in the liquid crystal display device of the embodiment 1, the thin film transistor is formed of the top-gate-type thin film transistor TFT where the gate electrode is arranged on a side closer to the liquid crystal layer than the semiconductor layer is, that is, where the gate electrode is arranged on a side more remote from the first substrate SUB1 than the semiconductor layer is. Further, the thin film transistor is formed of the thin film transistor TFT having the double gate structure which is constituted of: the thin film transistor TFT1 which has the drain side thereof directly electrically connected to the drain line DL; and the thin film transistor TFT2 which is connected to the thin film transistor TFT1 in series, and has a drain side thereof connected to a source side of the thin film transistor TFT1 and a source side thereof directly electrically connected to the pixel electrode PX.

The light blocking layer which is formed between the semiconductor layer and the first substrate and blocks a backlight light incident from the first substrate side is formed in such a manner that the light blocking layer overlaps with only the thin film transistor TFT1 as viewed in a plan view so that the light blocking layer blocks a backlight light incident on a thin film transistor TFT1 side and allows a backlight light incident on a thin film transistor TFT2 side to pass therethrough. Accordingly, a leak current attributed to the irradiation of a backlight light BL at the time of turning off the thin film transistor TFT, that is, a so-called off-leak current due to photo conductivity can be decreased by one thin film transistor TFT1 where light is blocked by the light blocking layer SF. As a result, a change in a holding voltage of the pixel can be suppressed and hence, it is possible to suppress the occurrence of vertical smear due to an off-leak current attributed to photo conductivity of the thin film transistor TFT of the pixel and thereby image quality can be enhanced.

Embodiment 2

Figure 5:
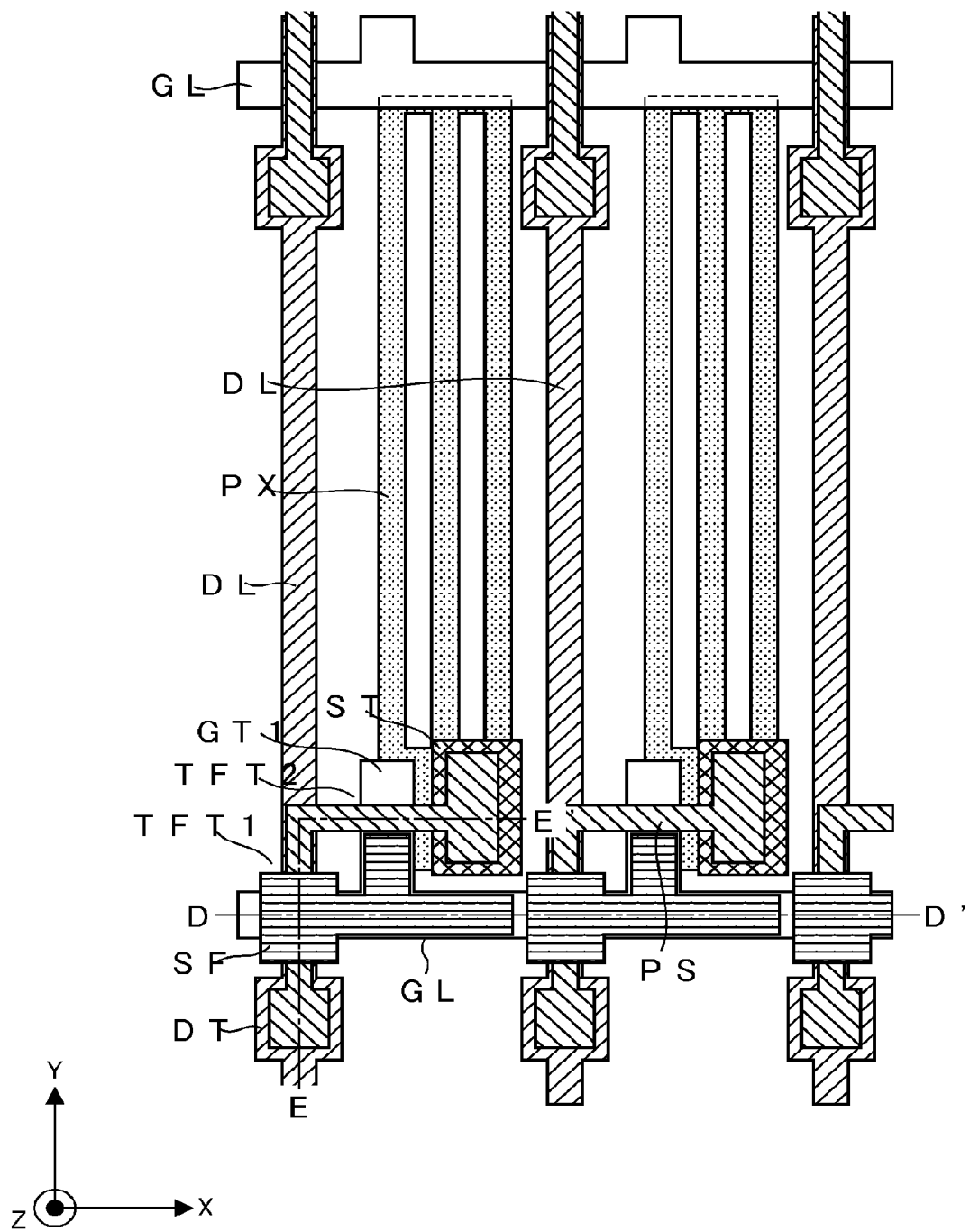
FIG. 5 is a plan view for explaining the detailed constitution of a pixel in a liquid crystal display device of an embodiment 2 of the present invention.
Figure 6:
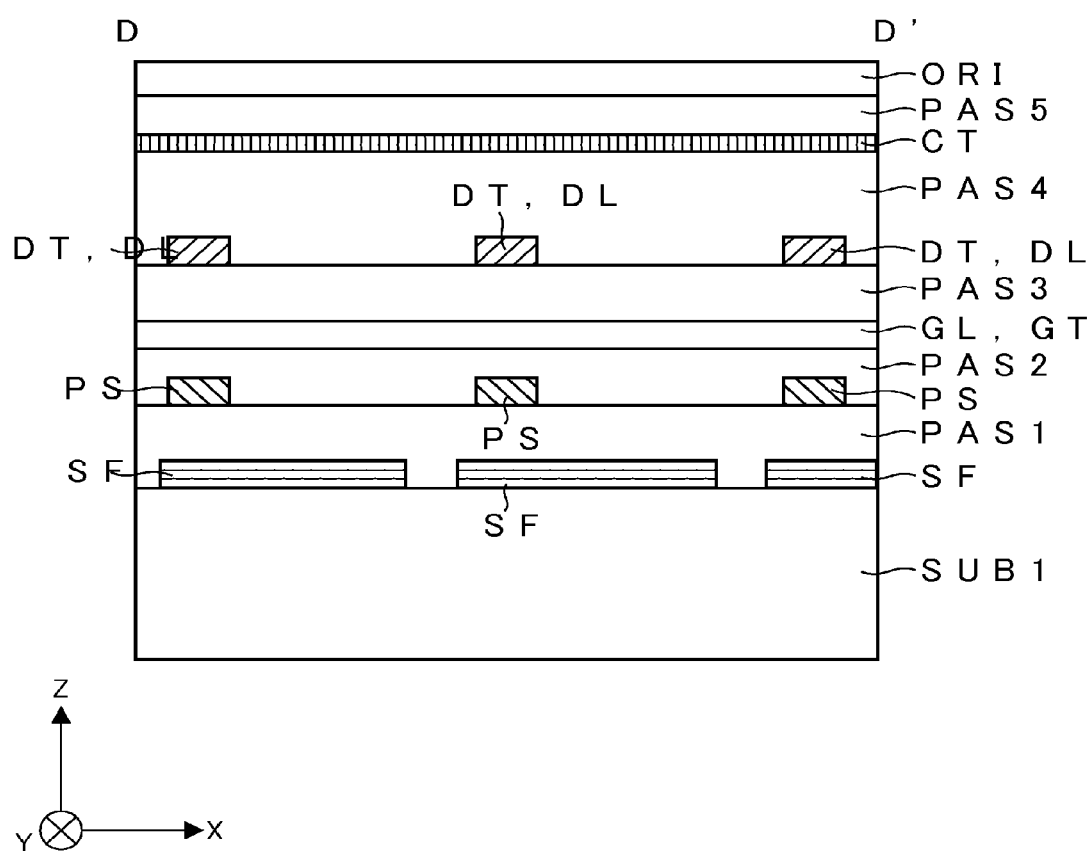
FIG. 6 is a cross-sectional view taken along a line D-D' in FIG. 5.

FIG. 5 is a plan view for explaining the detailed constitution of a pixel in a liquid crystal display device of an embodiment 2 of the present invention, and FIG. 6 is a cross-sectional view taken along a line D-D' in FIG. 5. Hereinafter, the liquid crystal display device according to the embodiment 2 is explained in conjunction with FIG. 5 and FIG. 6. The liquid crystal display device of the embodiment 2, however, differs from the liquid crystal display device of the embodiment 1 only with respect to the constitution of the light blocking layer SF, and the liquid crystal display device of the embodiment 2 is substantially equal to the liquid crystal display device of the embodiment 1 with respect to other constitutions. Accordingly, in the explanation made hereinafter, the light blocking layer SF is explained in detail. Further, the cross-sectional structure taken along a line E-E' shown in FIG. 5 is equal to the cross-sectional structure shown in FIG. 4.

As can be clearly understood from FIG. 5, a light blocking layer SF of the embodiment 2, together with a thin film transistor TFT1 which constitutes a thin film transistor TFT having the double gate structure, extends in the X direction along a gate line GL and overlaps with the gate line GL. Further, the light blocking layer SF is formed in an overlapping manner also on a part of an extension portion GT1 which extends from the gate line GL, and the light blocking layer SF extends such that an end portion of the light blocking layer SF which overlaps with the extension portion GT1 does not overlap with a semiconductor layer PS as viewed in a plan view. Due to such a constitution, the light blocking layer SF is configured not to overlap with a thin film transistor TFT2, that is, is configured not to overlap with a source region, a drain region and a channel region of the thin film transistor TFT2. Further, also in the constitution of the embodiment 2, the drain region and the source region of the thin film transistor TFT2 are formed such that the extension portion GT1 which extends in the Y direction overlaps with the semiconductor layer PS of the thin film transistor TFT2 which extends in the X direction, and the overlapping region forms the channel region of the thin film transistor TFT2.

Figure 16:
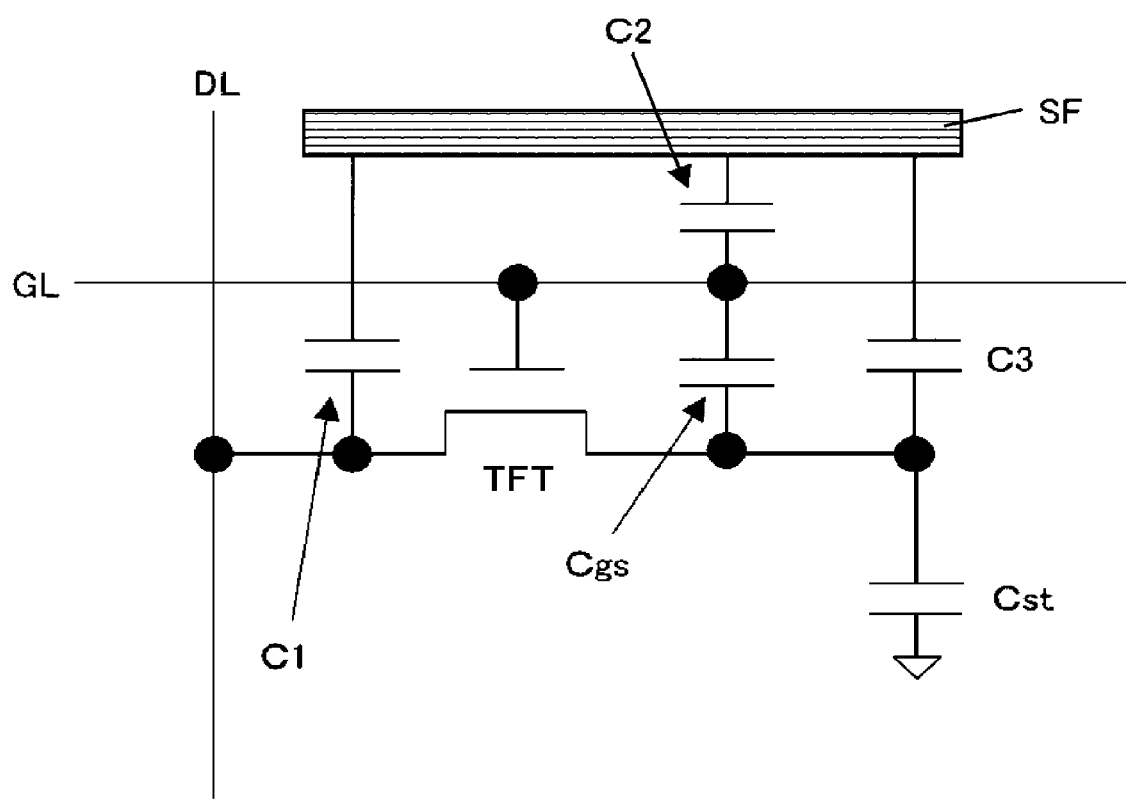
FIG. 16 is an equivalent circuit diagram of a pixel having a light blocking layer SF.

Accordingly, also in the thin film transistor TFT2 of the second embodiment, a capacitance between the extension portion GT1 which constitutes a source electrode and a source region (including the source electrode) of the thin film transistor TFT2 is formed of only a gate-source capacitance Cgs (shown in FIG. 16). As a result, even when a light blocking layer SF is formed, in the same manner as the embodiment 1, it is possible to prevent the increase of a feed-through voltage when a gate of the thin film transistor TFT2 which is directly connected to a pixel electrode PX is off and thereby display quality can be enhanced.

Further, as shown in FIG. 6, the light blocking layer SF of the embodiment 2 is configured to be arranged in an overlapping manner on the gate line GL by way of an insulation film PAS1 and an insulation film PAS2 which functions as gate insulation films and have relatively small film thicknesses. Further, the light blocking layer SF of the embodiment 2 is configured to overlap with the drain line DL by way of the insulation films PAS1, PAS2, PAS3, the semiconductor layer PS and the gate line GL. Accordingly, a capacitance between the light blocking layer SF and the gate electrode GT (gate line GL) (corresponding to the capacitance C2 in FIG. 16) is set extremely larger than a capacitance between the light blocking layer SF and the drain electrode DT (drain line DL) (corresponding to the capacitance C1 in FIG. 16). Accordingly, with respect to a parasitic capacitance of the thin film transistor TFT1, the capacitance C2 between the light blocking layer SF and the gate electrode GT (gate line GL) becomes dominant.

As a result, when a scanning signal is inputted for turning on the thin film transistor TFT1, a potential of the light blocking layer SF changes in the same manner as a potential of the gate electrode GT due to the capacitive coupling between the light blocking layer SF and the gate electrode GT (gate line GL), and this potential works as a back gate and hence, a quantity of ON current of the thin film transistor TFT1 can be increased whereby a pixel writing characteristic is enhanced thus giving rise to a particularly advantageous effect that the convergence of a pixel voltage can be decreased.

Figure 7:
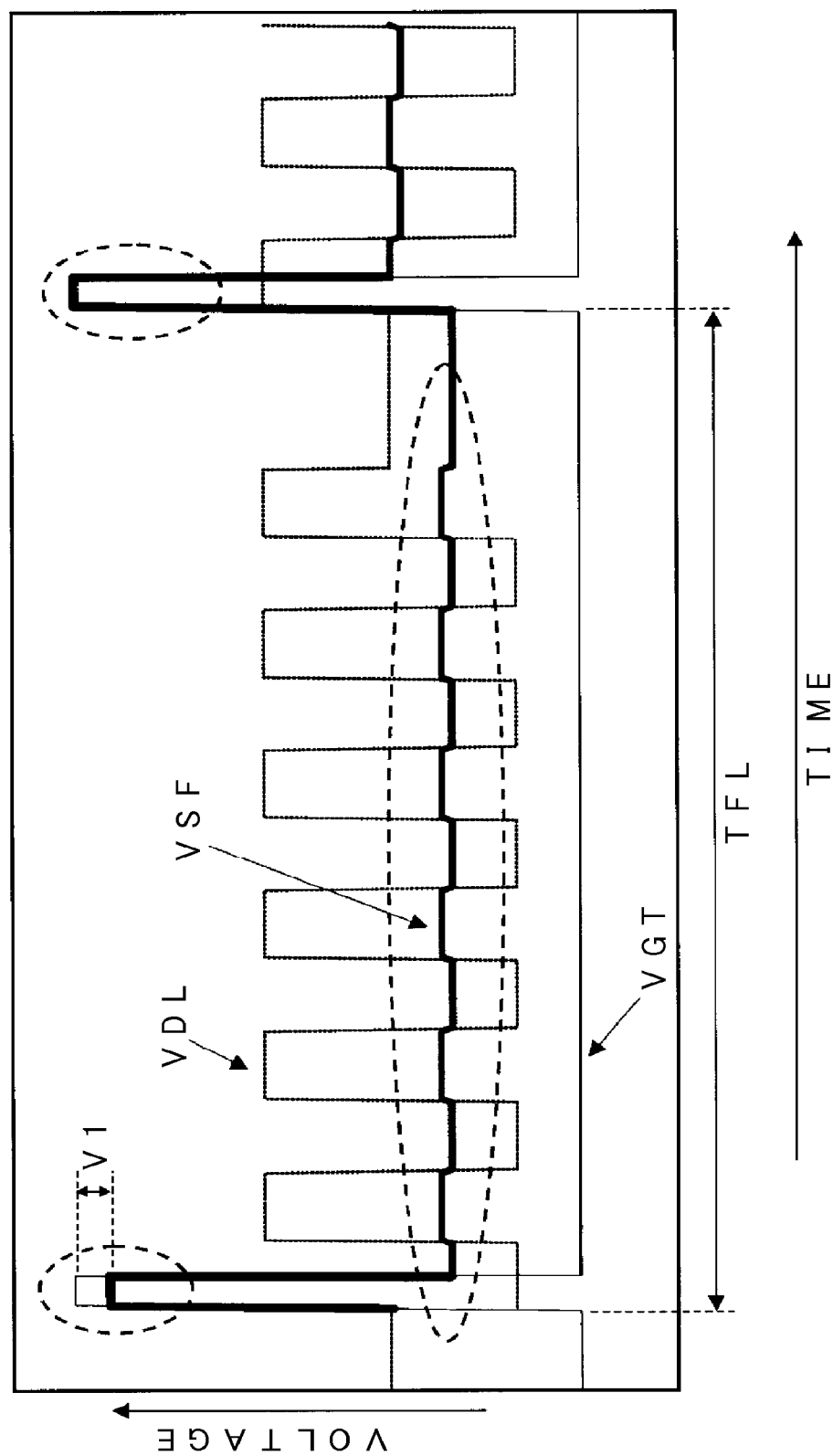
FIG. 7 is a view for explaining potentials at a gate electrode, a drain line and a light blocking layer respectively at the time of displaying an image on the liquid crystal display device of the embodiment 2 of the present invention.
Figure 17:
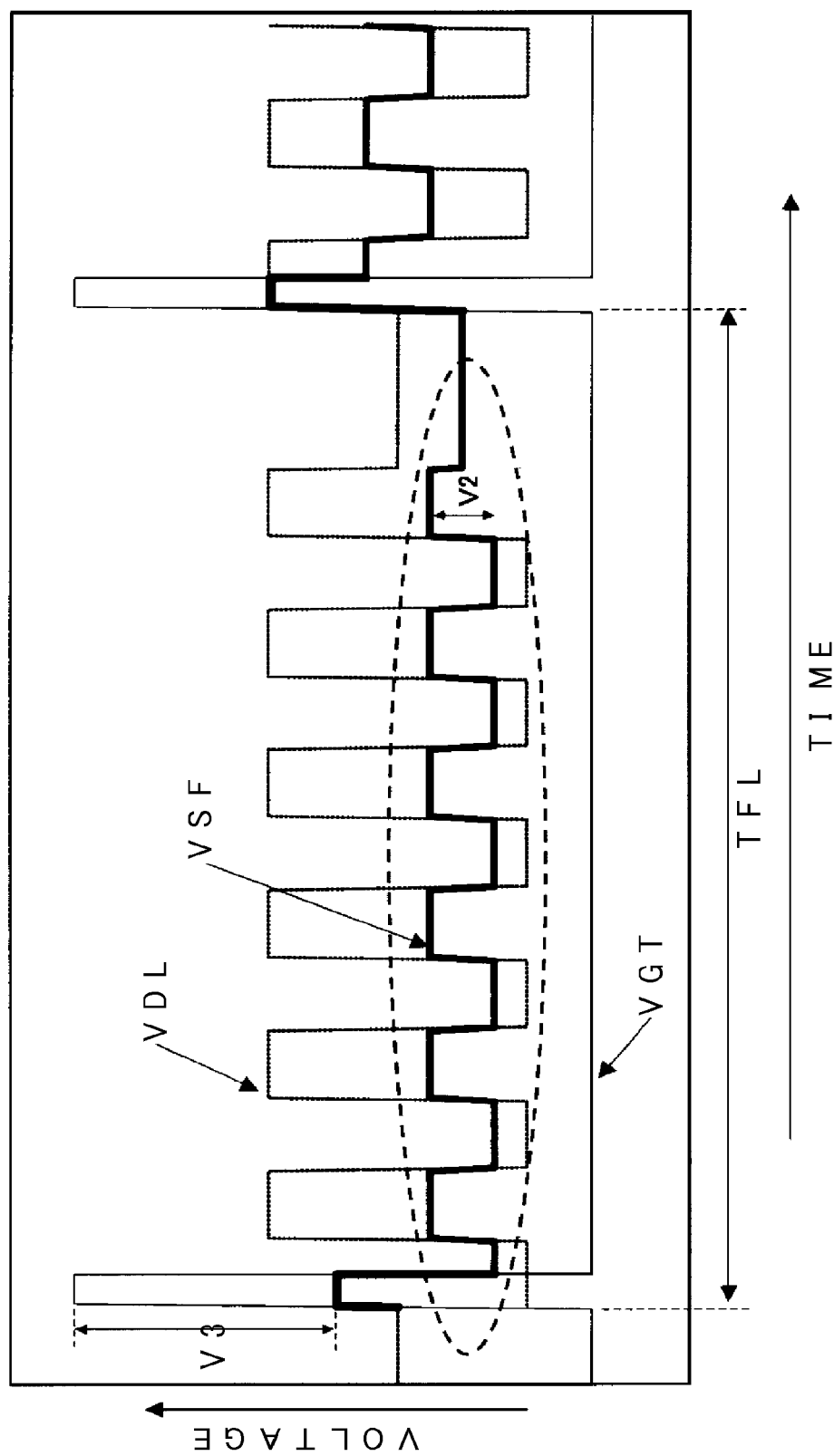
FIG. 17 is a view for explaining potentials at a gate electrode, a drain line and a light blocking layer respectively at the time of displaying an image on a liquid crystal display device of the embodiment 1 of the present invention.

Next, FIG. 7 is a view for explaining potentials at a gate electrode, a drain line and a light blocking layer respectively at the time of displaying an image on the liquid crystal display device of the embodiment 2 of the present invention, and FIG. 17 is a view for explaining potentials at a gate electrode, a drain line and a light blocking layer respectively at the time of displaying an image on a liquid crystal display device of the embodiment 1 of the present invention. Hereinafter, an effect of the light blocking layer SF of the embodiment 2 is explained in conjunction with FIG. 7 and FIG. 17.

The light blocking layer SF of the embodiment 1 is formed only in the region where the thin film transistor TFT1 is formed, and the semiconductor layer PS where the drain region of the thin film transistor TFT1 is formed is included in the region. Accordingly, in the constitution of the embodiment 1 where the light blocking layer SF is formed only in the region where the thin film transistor TFT1 is formed, compared to the constitution of the embodiment 2, the capacitance C1 between the light blocking layer SF and the drain line DL (drain electrode DT) becomes dominant with respect to the whole capacitance generated due to the formation of the light blocking layer SF. As a result, a potential VSF of the light blocking layer SF indicated by a bold line in FIG. 17 largely changes at a potential difference V3 along with a change of a drain voltage VDL by coupling. Further, a potential difference between a gate potential VGT and the potential VSF of the light blocking layer SF at the time of inputting a scanning signal (at the time that the gate potential VGT assumes a high potential) becomes a potential difference V2.

To the contrary, the light blocking layer SF of the embodiment 2 is formed in the region where the light blocking layer SF overlaps with the channel region of the thin film transistor TFT1 and also in the region where the light blocking layer SF overlaps with the gate line GL and the extension portion GL1 and hence, as shown in FIG. 7, a ratio of capacitance C1 between the light blocking layer SF and the drain line DL (drain electrode DT) with respect to the total capacitance generated due to the formation of the light blocking layer SF can be decreased so that a ratio of capacitance C2 between the light blocking layer SF and the gate line (gate electrode GT) with respect to the total capacitance can be increased. As a result, this embodiment can acquire a particular advantageous effect that a change in the potential VSF of the light blocking layer SF brought about by a change in the drain potential VDL attributed to coupling can be made extremely smaller than the potential difference V3. Further, this embodiment also can acquire a particular advantageous effect that a potential difference between the gate potential VGT and the potential VSF of the light blocking layer SF at the time of inputting a scanning signal can be set to a potential difference V1 which is extremely smaller than the potential difference V2.

Embodiment 3

Figure 8:
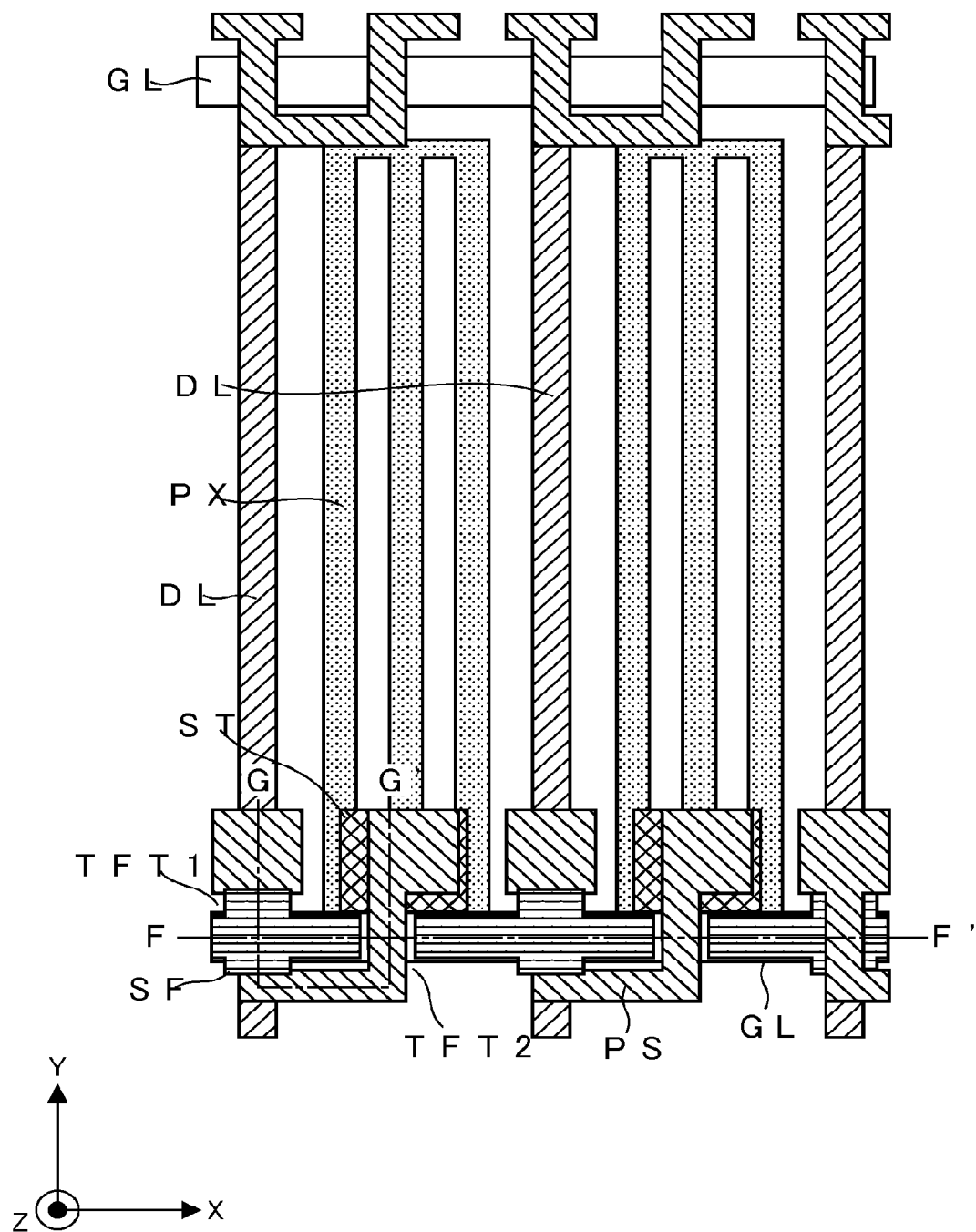
FIG. 8 is a plan view for explaining the detailed constitution of a pixel in a liquid crystal display device of an embodiment 3 of the present invention.
Figure 10:
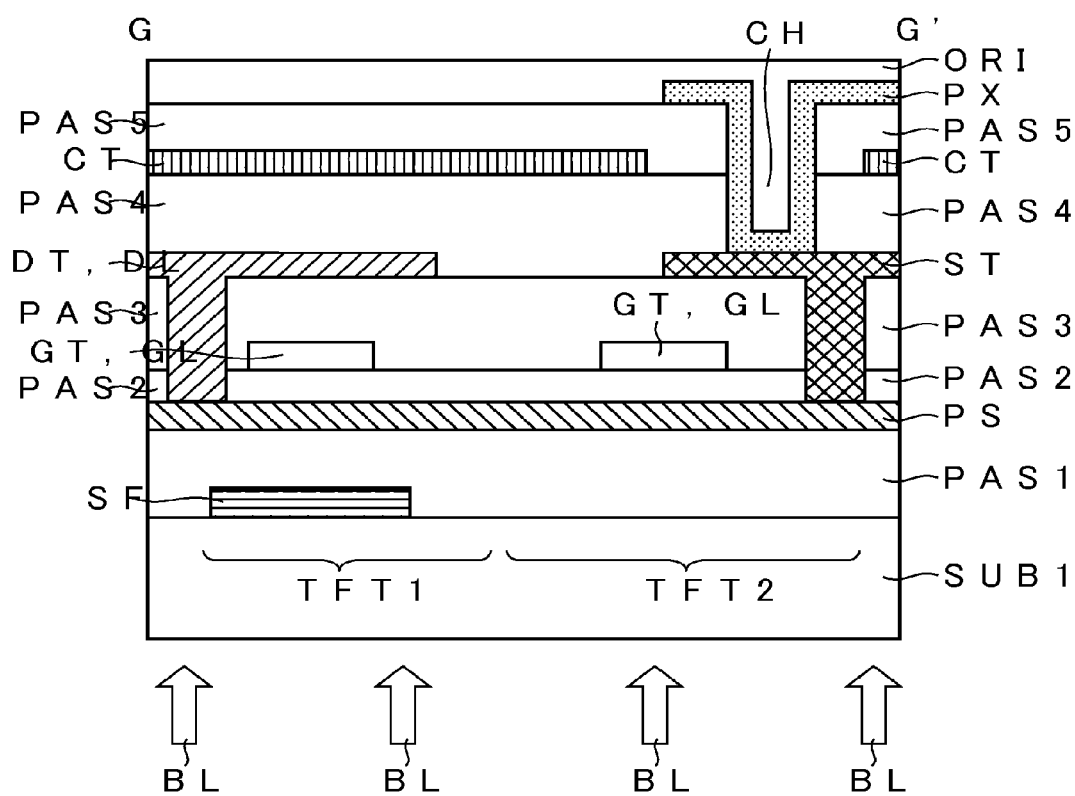
FIG. 10 is a cross-sectional view taken along a line G-G' in FIG. 8.

FIG. 8 is a plan view for explaining the detailed constitution of a pixel in a liquid crystal display device of an embodiment 3 of the present invention, FIG. 9 is a cross-sectional view taken along a line F-F' in FIG. 8, and FIG. 10 is a cross-sectional view taken along a line G-G' in FIG. 8. Hereinafter, the liquid crystal display device of the embodiment 3 is explained in conjunction with FIG. 8 to FIG. 10. The liquid crystal display device of the embodiment 3, however, differs from the liquid crystal display device of the embodiment 2 only with respect to the constitution of a semiconductor layer PS and a light blocking layer SF which constitute a top-gate-type thin film transistor TFT having the double gate structure, and the liquid crystal display device of the embodiment 3 is substantially equal to the liquid crystal display device of the embodiment 2 with respect to other constitutions. Accordingly, in the explanation made hereinafter, the semiconductor layer PS and the light blocking layer SF are explained in detail.

As shown in FIG. 8, in the thin film transistor TFT having the double gate structure of the embodiment 3, the semiconductor layer PS is formed in a U shape, and the semiconductor layer PS is formed so as to intersect with the same gate line CL twice so that a portion of a drain line DL is used as a drain electrode DT of the thin film transistor TFT1, and a portion of the gate line GL constitutes gate electrodes GT of the thin film transistors TFT1, TFT2. That is, the semiconductor layer PS of the embodiment 3 overlaps with the drain line DL in such a manner that the semiconductor layer PS intersects with the gate line GL from an upper side in the drawing with respect to the gate line GL, that is, on the same side as the pixel electrode PX, and extends toward a lower side in the drawing. Further, the semiconductor layer PS intersects with the gate line GL and, thereafter, is bent in the X direction and extends in the X direction and, thereafter, the semiconductor layer PS is bent in the Y direction and extends in the Y direction so as to intersect with the gate line GL and, thereafter, is electrically connected with the source electrode ST. That is, the semiconductor layer PS is configured such that one end and the other end of the semiconductor layer PS are arranged in a pixel region which is a region surrounded by a pair of gate lines GL and a pair of drain lines DL and where a pixel electrode PX is formed.

Due to such a constitution, in a region of the pixel where the drain line DL, the gate line GL and the semiconductor layer PS intersect with each other on a right lower side in the drawing, the thin film transistor TFT1 where the gate line GL constitutes the gate electrode GT is formed. Further, in a region of the pixel where the gate line GL and the semiconductor layer PS intersect with each other on a center lower side in the drawing, the thin film transistor TFT2 which is connected in series with the thin film transistor TFT1 and adopts the gate line GL as the gate electrode GT is formed. Due to such a constitution, the thin film transistor TFT having the double gate structure is formed. Also in the thin film transistor TFT having the double gate structure of the embodiment 3, the light blocking layer SF is formed so as to overlap with the thin film transistor TFT1 which is formed on a side close to the drain line DL, that is, which is directly connected to the drain line DL, and also a light blocking layer SF which overlaps with the thin film transistor TFT2 which is directly connected to the source electrode ST, that is, the pixel electrode PX is not formed. That is, as shown in FIG. 10, the light blocking layer SF is formed only on a first substrate SUB1 side of a channel region of the thin film transistor TFT1 which is directly connected to the drain line DL constituting the drain electrode DT, and the light blocking layer SF is not formed on a first substrate SUB1 side of a channel region of the thin film transistor TFT2. Accordingly, in the same manner as the embodiment 2, even when a backlight light BL indicated by an arrow is incident from a back surface side of the first substrate SUB1, it is possible to prevent the backlight light from being incident on the channel region of the thin film transistor TFT1 and hence, the embodiment 3 can acquire the substantially same advantageous effects as the embodiment 2.

Further, as shown in FIG. 9, in the thin film transistor TFT having the double gate structure of the embodiment 3, the thin film transistor TFT1 and the thin film transistor TFT2 are arranged parallel to each other in the extension direction of the gate line GL. Accordingly, in the same manner as the embodiment 2, when the light blocking layer SF corresponding to each pixel is simply provided within the pixel region, an area of the region where the light blocking layer SF and the gate line GL overlap with each other is decreased. Accordingly, in the light blocking layer SF of the embodiment 3, in forming the light blocking layer SF which overlaps with the thin film transistor TFT1 by extending the light blocking layer SF in the X direction which is the extension direction of the gate line GL, the light blocking layer SF is made to extend toward areas in the vicinity of the thin film transistors TFT2 of pixels arranged adjacent to the pixel in the X direction (neighboring pixels). That is, the light blocking layer SF is formed in the regions where the thin film transistor TFT2 is not formed along the gate line GL. Due to such a constitution, even when the constitution where two thin film transistors TFT1, TFT2 are arranged adjacent to each other along the extension direction of the gate line GL is adopted, an area where the light blocking layer SF and the gate line GL overlap with each other can be sufficiently increased and hence, a capacitance (coupling capacitance) between the light blocking layer SF and the gate line GL (gate electrode GT) can be sufficiently increased. Accordingly, it is possible to ensure a capacitance (coupling capacitance) between the light blocking layer SF and the gate line GL (gate electrode GT) which becomes necessary for acquiring the substantially same advantageous effects as the embodiment 2.

Embodiment 4

Figure 11:
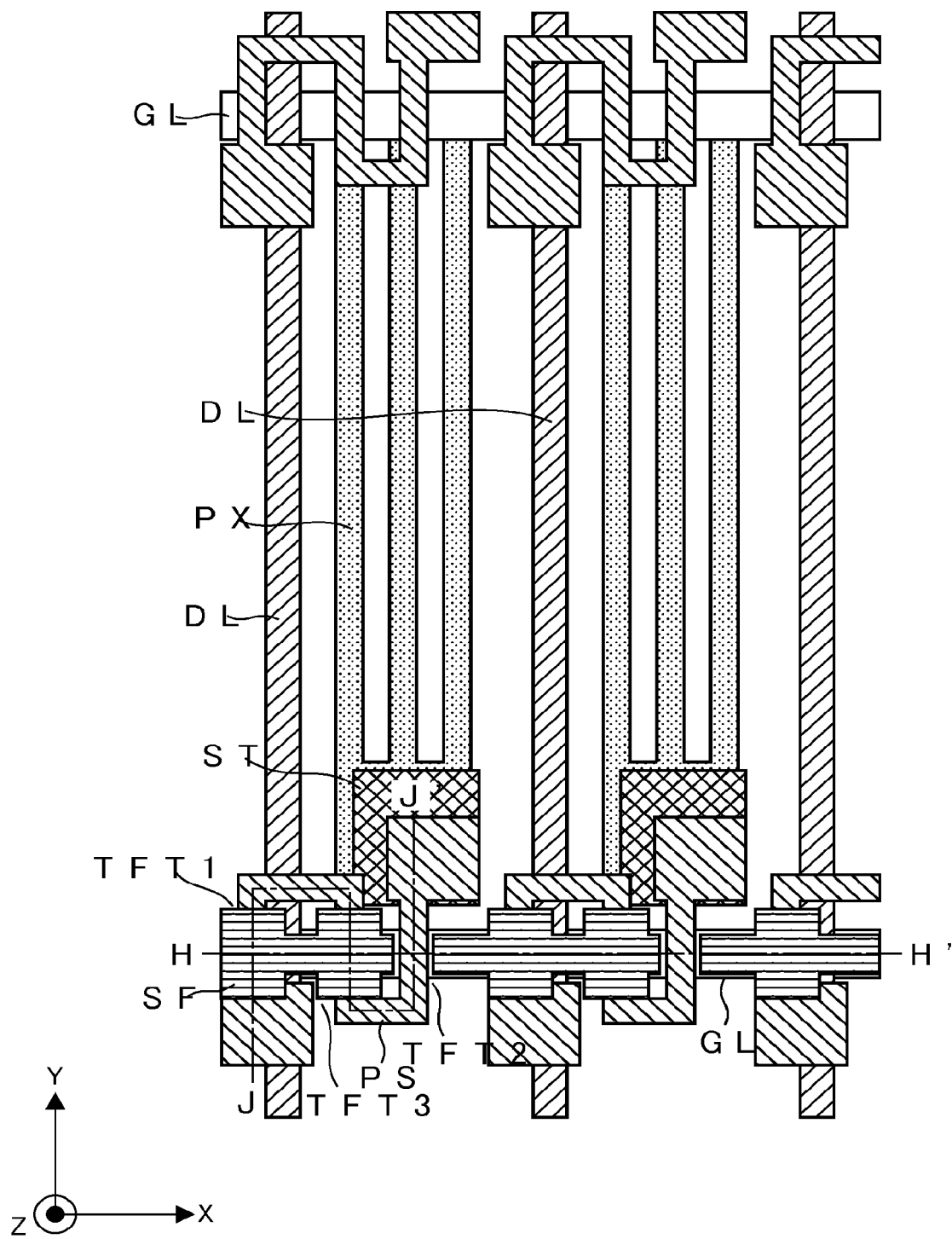
FIG. 11 is a plan view for explaining the detailed constitution of a pixel in a liquid crystal display device of an embodiment 4 of the present invention.
Figure 12:
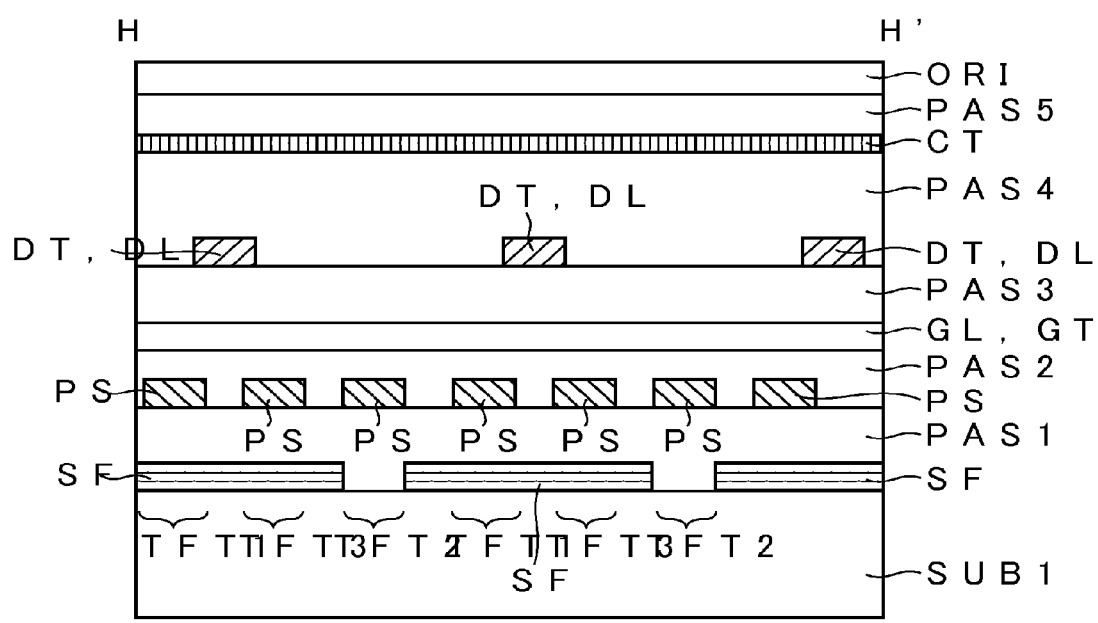
FIG. 12 is a cross-sectional view taken along a line H-H' in FIG. 11.
Figure 13:
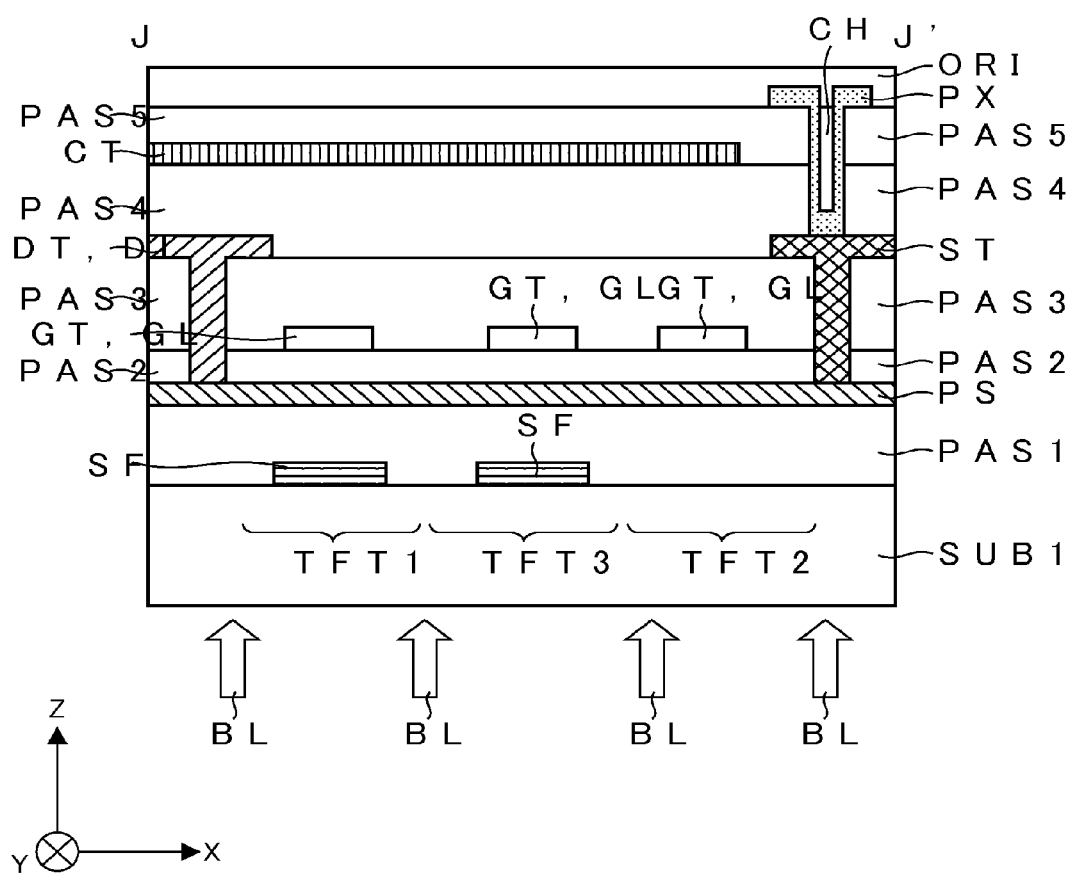
FIG. 13 is a cross-sectional view taken along a line J-J' in FIG. 11.
Figure 14:
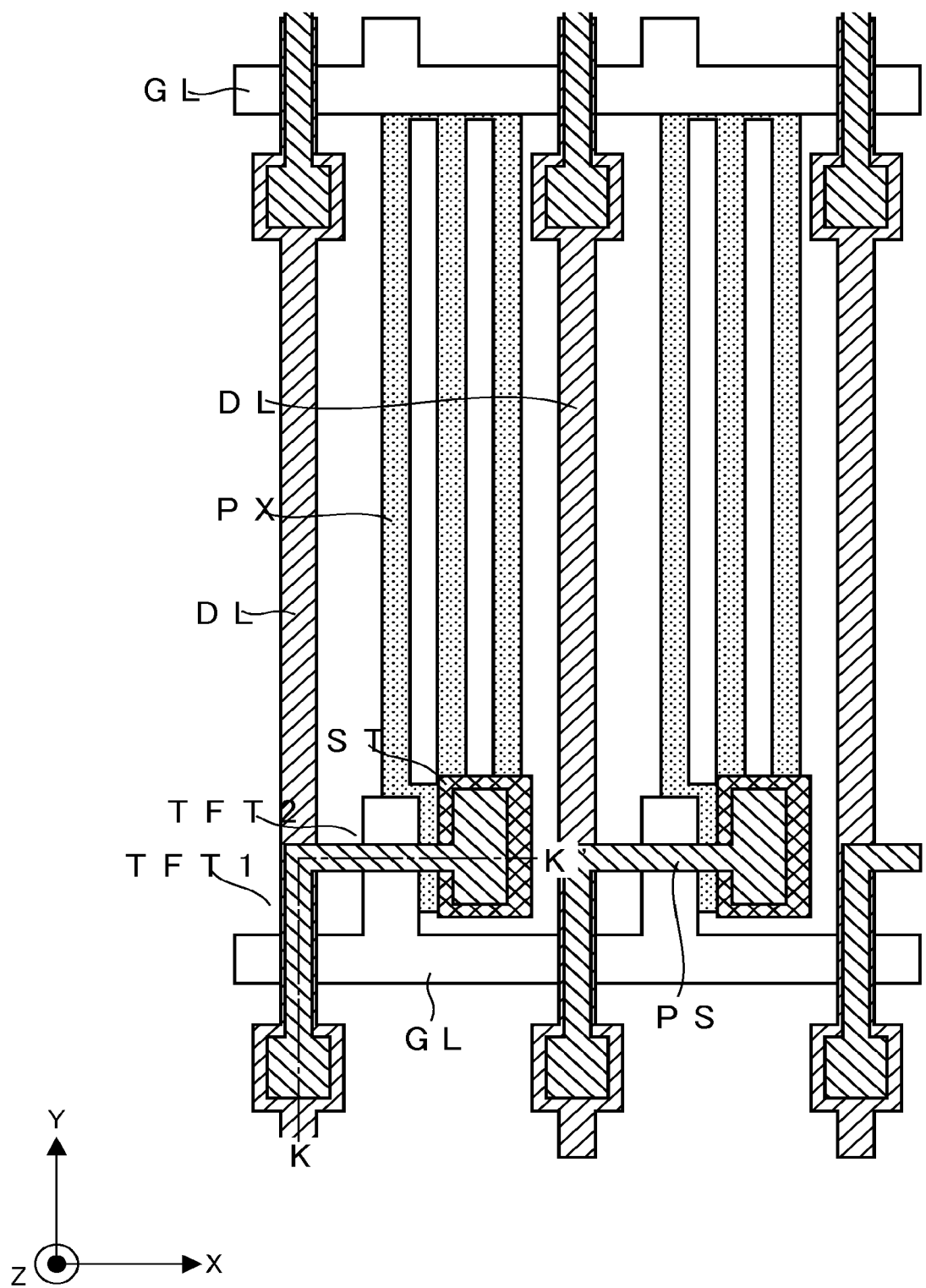
FIG. 14 is a view for explaining the detailed constitution of a pixel in a conventional liquid crystal display device.
Figure 15:
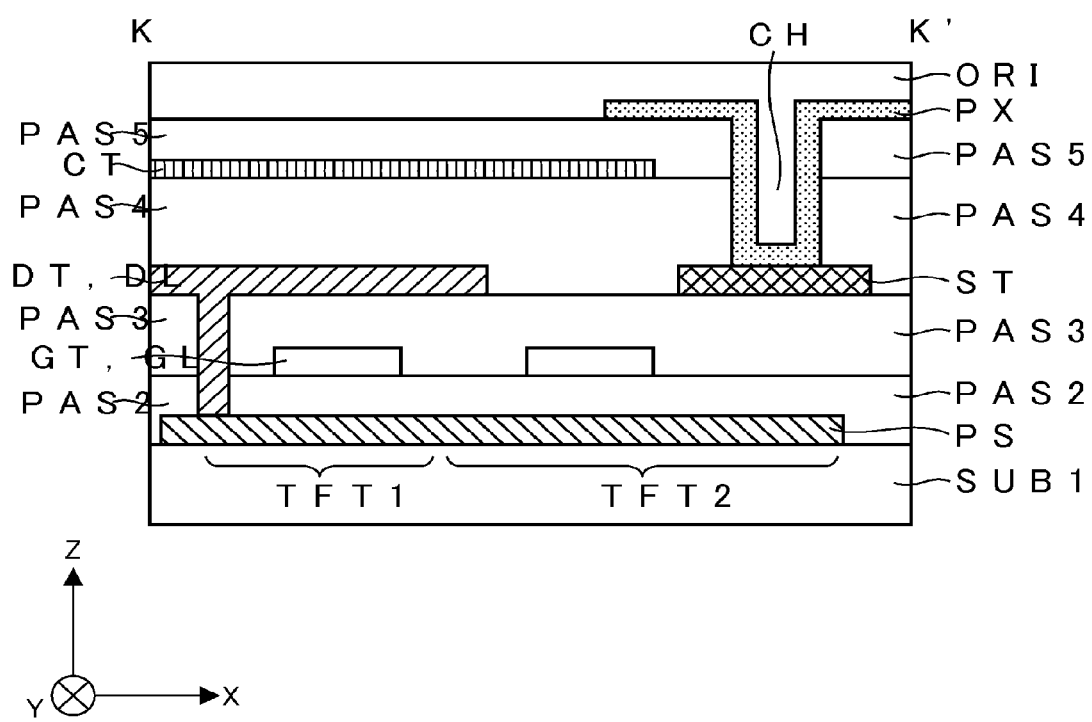
FIG. 15 is a cross-sectional view taken along a line K-K' in FIG. 14.

FIG. 11 is a plan view for explaining the detailed constitution of a pixel in a liquid crystal display device of an embodiment 4 of the present invention, FIG. 12 is a cross-sectional view taken along a line H-H' in FIG. 11, and FIG. 13 is a cross-sectional view taken along a line J-J' in FIG. 11. Hereinafter, the liquid crystal display device of the embodiment 4 is explained in conjunction with FIG. 11 to FIG. 13. The liquid crystal display device of the embodiment 4 differs from the liquid crystal display device of the embodiment 3 only with respect to the constitution of a top-gate-type thin film transistor having three gate structure (hereinafter referred to as the top-gate-type thin film transistor having the triple gate structure) TFT as the top-gate-type thin film transistor TFT having a multi-gate structure, and the liquid crystal display device of the embodiment 4 is substantially equal to the liquid crystal display device of the embodiment 3 with respect to other constitutions. Accordingly, in the explanation made hereinafter, the top-gate-type thin film transistor TFT having the triple gate structure is explained in detail.

As shown in FIG. 11, in the thin film transistor TFT having the triple gate structure of the embodiment 4, a semiconductor layer PS is formed in an S shape, and the semiconductor layer PS is formed so as to intersect with the same gate line GL three times and hence, a portion of a drain line DL is used as a drain electrode DT of a thin film transistor TFT1, and portions of the gate line GL constitute gate electrodes GT of thin film transistors TFT1, TFT2, TFT3. That is, the semiconductor layer PS of the embodiment 4 overlaps with the drain line DL in such a manner that the semiconductor layer PS intersects with the gate line GL from a side below the gate line GL in the drawing, that is, from a lower side pixel in the drawing, and extends toward an upper side in the drawing. Further, the semiconductor layer PS is bent in the X direction after intersecting with the gate line GL and extends in the X direction and, thereafter, is bent in the Y direction and intersects with the gate line GL in the Y direction and, thereafter, the semiconductor layer PS is bent in the X direction and extends in the X direction again and, thereafter, is bent in the Y direction and extends in the Y direction so as to intersect with the gate line GL and, thereafter, the semiconductor layer PS is electrically connected to a source electrode ST. That is, in the same manner as the embodiment 1, the other end of the semiconductor layer PS is arranged in a pixel region which is a region surrounded by a pair of gate lines GL and a pair of drain lines DL and where a pixel electrode PX is formed, and one end of the semiconductor layer PS is arranged within a pixel region arranged adjacent to the pixel region in the Y direction.

Due to such a constitution, in a region of the pixel where the drain line DL, the gate line GL and the semiconductor layer PS intersect with each other on a right lower side in the drawing, the thin film transistor TFT1 where the gate line GL constitutes the gate electrode GT is formed. Further, in a region of the thin film transistor TFT1 where the gate line GL and the semiconductor layer PS intersect with each other on a right side in the drawing, the thin film transistor TFT3 where the gate line GL constitutes the gate electrode GT is formed and the thin film transistor TFT3 is connected in series with the thin film transistor TFT1. Further, in a region of the thin film transistor TFT3 where the gate line GL and the semiconductor layer PS intersect with each other on a right side in the drawing, the thin film transistor TFT2 where the gate line GL constitutes the gate electrode GT is formed, and the thin film transistors TFT1 to TFT3 are connected to each other in series via the thin film transistor TFT3 thus forming the thin film transistor TFT having the triple gate structure. Also in the thin film transistor TFT having the triple gate structure of the embodiment 4, the light blocking layer SF is not formed in an overlapping manner on only the thin film transistor TFT2 which is directly connected to the source electrode ST, that is, the pixel electrode PX, and the light blocking layer SF is formed in an overlapping manner on the thin film transistor TFT1 which is formed on a side close to the drain line DL, that is, which is directly connected to the drain line DL, and the thin film transistor TFT3 which is connected in series to the thin film transistor TFT1 and the thin film transistor TFT2.

In this manner, in the constitution of the embodiment 4, between the thin film transistor TFT1 and the thin film transistor TFT2 of the embodiment 3, the thin film transistor TFT3 covered with the light blocking layer SF is formed. That is, as shown in FIG. 13, the light blocking layer SF is formed only on a first substrate SUB1 side of a channel region of the thin film transistor TFT1 which is directly connected to the drain line DL which constitutes the drain electrode DT and on a channel region of the thin film transistor TFT3 which is directly connected to the thin film transistor TFT1, and the light blocking layer SF is not formed on a first substrate SUB1 side of a channel region of the thin film transistor TFT2. Accordingly, in the same manner as the embodiment 3, even when a backlight light BL indicated by an arrow is incident from a back surface side of the first substrate SUB1, the light blocking layer SF can prevent the backlight light from being incident on the channel regions of the thin film transistors TFT1, TFT3 and hence, this embodiment 4 can acquire the substantially same advantageous effects as the embodiment 3.

Further, as shown in FIG. 12, also in the thin film transistor TFT having the triple gate structure of the embodiment 4, in forming the light blocking layer SF which overlaps with the thin film transistors TFT1, TFT3 by extending the light blocking layer SF in the X direction which is the extension direction of the gate line GL, the light blocking layer SF is made to extend to areas in the vicinity of the thin film transistors TFT2 of pixels arranged adjacent to the pixel in the X direction (neighboring pixels). That is, the light blocking layer SF is formed in a region where the thin film transistor TFT2 is not formed along the gate line GL. Accordingly, in the same manner as the embodiment 3, an area of overlapping between the light blocking layer SF and the gate line GL can be sufficiently increased and hence, a capacitance (coupling capacitance) between the light blocking layer SF and the gate line GL (gate electrode GT) can be sufficiently increased.

In the constitution of the embodiment 4, out of three thin film transistors TFT1 to TFT3 which are connected in series, two thin film transistors TFT1, TFT3 are light-blocked by the light blocking layer SF. Accordingly, it is possible to suppress an optical leak current generated due to the incidence of a backlight light on the semiconductor layer more effectively at the time of turning off the thin film transistors TFT1 to TFT3 thus acquiring a particular advantageous effect that display quality can be enhanced.

In the liquid crystal display devices of the embodiments 1 to 4, the explanation has been made with respect to the case where the low-temperature poly-crystalline silicon thin film is used as the semiconductor layer PS in the thin film transistors TFT1, TFT2, TFT3. However, for example, it may be possible to adopt the thin film transistors TFT1, TFT2, TFT3 which use a micro-crystalline silicon thin film as the semiconductor layer PS.

In the liquid crystal display devices of the embodiments 1 to 4, the explanation has been made with respect to the case of so-called single domain where the linear pixel electrode PS extends only in the Y direction. However, it may be possible to adopt the so-called multi domain structure where the extension direction of the linear pixel electrode is inclined in two or more directions with respect to the Y direction.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A liquid crystal display device comprising:
a first substrate;
gate lines extending in a X direction on the first substrate;
drain lines extending in a Y direction on the first substrate;
a thin film transistor of a top-gate-type and a multi-gate type outputting a video signal from one of the drain lines to a pixel electrode in synchronism with a scanning signal from one of the gate lines, the thin film transistor having a first semiconductor layer as a first channel and a second semiconductor layer as a second channel;
a second substrate facing the first substrate;
a liquid crystal layer sandwiched between the first substrate and the second substrate;
a backlight arranged in an opposing side of the first substrate against a side of the first substrate which is formed with the thin film transistor; and
a light blocking layer formed between the first semiconductor layer and the backlight without extending between the second semiconductor layer and the backlight, wherein
the thin film transistor has a gate electrode formed on a side more remote from the first substrate than the first semiconductor layer and the second semiconductor layer in a cross-sectional view,
the light blocking layer overlaps with the gate electrode, and
the gate electrode has edges opposite to each other in a width direction of the one of the gate lines, located within an area of the light blocking layer between opposite sides in the width direction.

2. The liquid crystal display device according to claim 1, wherein
the gate electrode has edges opposite to each other in an extension direction of one of the gate lines, located within an area of the light blocking layer between opposite sides in the extension direction.

3. The liquid crystal display device according to claim 1, wherein the light blocking layer is formed of a conductive thin film overlapping with the first semiconductor layer, the second semiconductor layer and the one of the gate lines by way of an insulation film, and the light blocking layer is formed electrically independently for every pixel.

4. The liquid crystal display device according to claim 1, wherein the first semiconductor layer and the second semiconductor layer are arranged adjacent to each other in an extension direction along the one of the gate lines, and
the light blocking layer is formed along the one of the gate lines, and is formed so as to cover a region between the first semiconductor layer and the second semiconductor layer formed for respective pixels arranged adjacent to each other in an extension direction of the one of the gate lines.

5. The liquid crystal display device according to claim 1, wherein the first semiconductor layer and the second semiconductor layer are formed in a U shape such that the first semiconductor layer and the second semiconductor layer three-dimensionally intersect with the one of the gate lines at two portions.

* * * * *